(12) United States Patent
Kim et al.

(10) Patent No.: US 11,222,810 B1
(45) Date of Patent: Jan. 11, 2022

(54) COLOR FILTER STRUCTURE AND METHOD TO CONSTRUCT TOPOGRAPHY OF STACK STRUCTURE

(71) Applicant: Himax Imaging Limited, Tainan (TW)

(72) Inventors: Kihong Kim, Tainan (TW); Yu-Jui Hsieh, Tainan (TW)

(73) Assignee: Himax Imaging Limited, Tainan (TW)

( * ) Notice: Subject to any disclaimer, the term of this patent is extended or adjusted under 35 U.S.C. 154(b) by 30 days.

(21) Appl. No.: 16/988,713

(22) Filed: Aug. 9, 2020

(51) Int. Cl.
*H01L 21/762* (2006.01)
*G03F 7/00* (2006.01)
*G02B 5/20* (2006.01)
*H01L 27/146* (2006.01)

(52) U.S. Cl.
CPC .......... *H01L 21/76229* (2013.01); *G02B 5/20* (2013.01); *G03F 7/0007* (2013.01); *H01L 27/14621* (2013.01); *H01L 27/14685* (2013.01)

(58) Field of Classification Search
CPC .............. G02B 5/20; G03F 7/0007; H01L 21/76224–76237; H01L 21/76283; H01L 21/76286; H01L 27/14621; H01L 27/14685

USPC ....... 250/226; 359/491.01, 885; 438/70, 199
See application file for complete search history.

(56) References Cited

U.S. PATENT DOCUMENTS

| | | | |
|---|---|---|---|
| 2016/0086985 A1* | 3/2016 | Chung | H01L 27/1463 257/432 |
| 2017/0047367 A1* | 2/2017 | Lee | H01L 27/14685 |
| 2018/0261495 A1* | 9/2018 | Yang | H01L 21/76237 |
| 2020/0058549 A1* | 2/2020 | Choi | H01L 21/76898 |

* cited by examiner

*Primary Examiner* — Colin W Kreutzer
(74) *Attorney, Agent, or Firm* — Winston Hsu (57) ABSTRACT

A color filter structure includes a material stack disposed on a substrate, a material stack disposed in the substrate, a first trench penetrating the material stack and exposing a first metal pad, a scribe line trench penetrating the material stack and exposing a scribe line metal pad, a first filling material partially filling the first trench and substantially filling up the scribe line trench, a second filling material partially filling the first trench and the first filling material and the second filling material together substantially fill up the first trench, and a color filter material covering an optical uniform surface which the material stack, the first filling material and the second filling material together form.

19 Claims, 9 Drawing Sheets

Bad

FIG. 6A

Good

FIG. 6B

COLOR FILTER STRUCTURE AND METHOD TO CONSTRUCT TOPOGRAPHY OF STACK STRUCTURE

BACKGROUND OF THE INVENTION

1. Field of the Invention

The present invention generally relates to a color filter structure and a method to construct topography of a stack structure. In particular, the present invention generally relates to a color filter structure to be free of optical striation by visual inspection and a method to construct a stack structure with ideal topography to support a color filter.

2. Description of the Prior Art

For the manufacture of CMOS image sensors, if the BSI production backside topography is not flat, it would make the subsequent CF process coating performance worse and cause a striation issue. Striation is visual phenomena as a result of abnormal color filter process. For the CF coating process, if all Red/Green/Blue color filters are processed, the striation problem becomes more noticeable to adversely affect the quality of the products.

SUMMARY OF THE INVENTION

Given the above, the present invention proposes a color filter structure and a method to construct topography of a stack structure. The stack structure of the present invention provides an optical uniform surface with ideal topography to be free of optical striation by visual inspection. The method to construct topography of a stack structure of the present invention proposes a novel approach to construct an optical uniform surface with ideal topography to support a color filter. The color filter structure is novel because it is atop an optical uniform surface so the color filter may be free of optical striation by visual inspection. This solution improves fill-in processes to make the backside surface flatter.

In one aspect of the present invention, a color filter structure is proposed. The color filter structure includes a substrate, a first metal pad, a scribe line metal pad, a material stack, a first trench, a scribe line trench, a first filling material, a second filling material, and a color filter material. The substrate includes a first die region and a scribe line region adjacent to the first die region. The first metal pad is disposed in the first die region and in the substrate. The scribe line metal pad is disposed in the scribe line region and in the substrate. The material stack is disposed on the substrate and covers the first die region and the scribe line region. The first trench penetrates the material stack and the substrate and exposes the first metal pad. The scribe line trench penetrates the material stack and the substrate and exposes the scribe line metal pad. The first filling material partially fills the first trench and substantially fills up the scribe line trench. The second filling material partially fills the first trench. The first filling material and the second filling material together substantially fill up the first trench. The material stack, the first filling material and the second filling material together form an optical uniform surface. The color filter material covers the optical uniform surface.

In one embodiment of the present invention, the color filter structure further includes a second die region and a second trench. The substrate includes the second die region and the second die region is adjacent to the scribe line region so that the scribe line region is disposed between the first die region and the second die region. The second trench penetrates the material stack and exposes the substrate in the second die region. The first filling material and the second filling material together substantially fill up the second trench. The color filter material covers the second trench.

In another embodiment of the present invention, the width of the scribe line trench is smaller than the width of at least one of the first trench and the second trench.

In another embodiment of the present invention, the color filter structure further includes a first depression disposed on the second filling material of the first trench. The color filter material covers the first depression without deforming the optical uniform surface.

In another embodiment of the present invention, the color filter structure further includes a second depression disposed on the second filling material of the second trench. The color filter material covers the second depression without deforming the optical uniform surface.

In another embodiment of the present invention, the material stack includes a silicon material, a high K material and an oxide.

In another embodiment of the present invention, at least one of the first filling material and the second filling material includes a photoresist material.

In another aspect of the present invention, a method to construct topography of a stack structure is proposed. First, a layer stack is provided. The layer stack includes a substrate, a first metal pad, a scribe line metal pad, a material stack, a first trench, and a scribe line trench. The substrate includes a first die region and a scribe line region adjacent to the first die region. The first metal pad is disposed in the first die region and in the substrate. The scribe line metal pad is disposed in the scribe line region and in the substrate. The material stack is disposed on the substrate and covers the first die region and the scribe line region. The first trench penetrates the material stack and the substrate and exposes the metal pad. The scribe line trench penetrates the material stack and the substrate and exposes the scribe line metal pad. Second, a first filling process is carried out to fill the first trench and the scribe line trench with a first filling material. Then, a second filling process is carried out to fill the first trench with a second filling material without filling the scribe line trench to obtain a stack structure. The first filling material and the second filling material together substantially fill up the first trench. The material stack, the first filling material and the second filling material together form an optical uniform surface to construct topography of the stack structure. The optical uniform surface is further covered with a color filter material to obtain a color filter structure.

In one embodiment of the present invention, the first filling process includes the following steps. First, a first fill-in step is carried out to fill the first trench and the scribe line trench with a first filling material and a first residual is formed to be disposed on the surface of the material stack. Second, a first trimming step is carried out to remove the first residual.

In another embodiment of the present invention, the second filling process includes the following steps. First, a second fill-in step is carried out to fill the first trench with the second filling material and a second residual is formed to be disposed on the surface of the material stack. Second, a second trimming step is carried out to remove the second residual.

In another embodiment of the present invention, the first filling material partially fills the first trench and substantially fills up the scribe line trench after the first filling process.

In another embodiment of the present invention, the method to construct topography of a stack structure further includes the following steps. First, the first filling process is carried out to fill a second trench with a first filling material. The second trench penetrates the material stack and exposes the substrate in a second die region. Second, the second filling process is carried out to fill the second trench with the second filling material. The first filling material and the second filling material together substantially fill up the second trench.

In another embodiment of the present invention, the width of the scribe line trench is smaller than the width of at least one of the first trench and the second trench.

In another embodiment of the present invention, the method to construct topography of a stack structure further includes the following steps. First, a first depression which is disposed on the second filling material of the first trench is filled up with the color filter material. The color filter material covers the first depression without deforming the optical uniform surface.

In another embodiment of the present invention, the method to construct topography further includes the following steps. First, a second depression which is disposed on the second filling material of the second trench is filled up with the color filter material. The color filter material covers the second depression without deforming the optical uniform surface.

In another embodiment of the present invention, the material stack includes a silicon material, a high K material and an oxide.

In another embodiment of the present invention, at least one of the first filling material and the second filling material includes a photoresist material.

In another embodiment of the present invention, the color filter material atop the optical uniform surface is free of optical striation by visual inspection.

The method of the present invention proposes a second filling process to facilitate the filling of trenches of different widths in addition to a first filling process. After the second filling process, trenches of different widths may be substantially filled up with sufficient filling materials to diminish any possible recess or depression disposed on the filling material in any trench. Accordingly, the material stack, the first filling material and the second filling material may together form an optical uniform surface to construct ideal topography of the stack structure. Moreover, the ideal topography is advantageous to keep a color filter atop the optical uniform surface from generating undesirable optical striation when the color filter is examined by visual inspection to obtain a color filter structure of better quality and yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
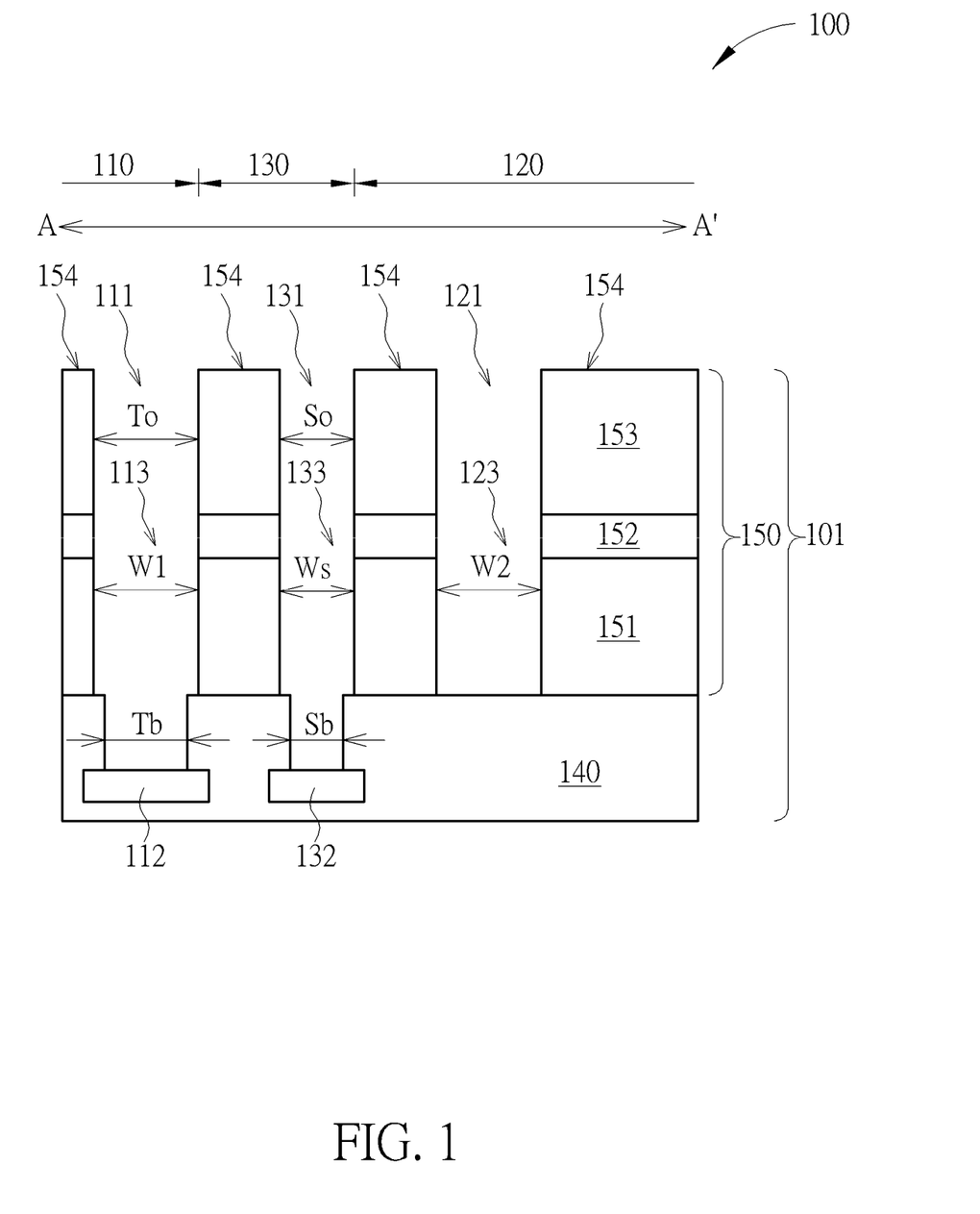
FIG. 1 to FIG. 4 illustrate a cross-sectional view of a process to construct a stack structure with ideal topography in a wafer in accordance with one example of the present invention.
Figure 1A:
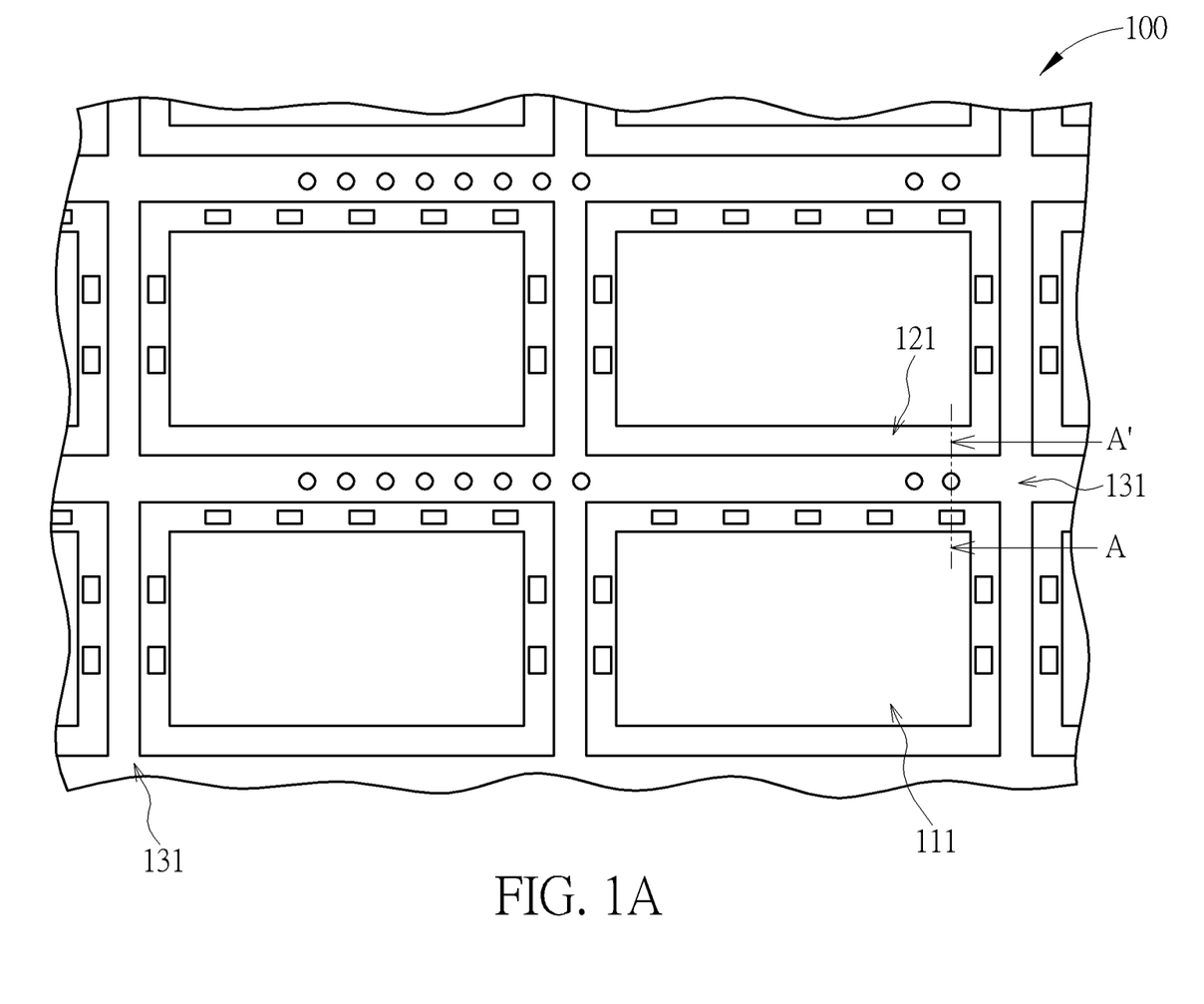
FIG. 1A illustrates a top view of a wafer including dies, scribe lines, a first die region, a second die region and a scribe line region in accordance with one example of the present invention.

The present invention in a first aspect provides a novel method to construct a stack structure with ideal topography in a wafer to support a color filter. FIG. 1 to FIG. 5 illustrate a cross-sectional view of a process to construct a stack structure with ideal topography in a wafer in accordance with examples of the present invention. FIG. 1A illustrates a top view of a wafer with dies and scribe lines to show at least a first die region, a second die region and a scribe line region in accordance with examples of the present invention. FIG. 1 illustrates a cross-sectional view along the line A-A' shown in FIG. 1A.

First, as shown in FIG. 1A, there may be multiple dies along with multiple scribe lines disposed in a wafer 100. Two adjacent dies are divided by a scribe line 131 so there may be different regions present on the wafer 100, for example a bottom pad region, a WAT pad region and a CP pad region. The WAT pad region may be located in the scribe line 131 between adjacent dies, but the present invention is not limited thereto. Further, the bottom pad region and the CP pad region may be respectively located in two different dies, such as a first die 111 and a second die 121, which are adjacent to each other, but the present invention is not limited thereto. The dies on the wafer 100 may be for use in CMOS image sensors (CIS), for example the wafer may be used for the backside illumination production of CIS.

An example of the process of the present invention is given as follows in accordance with the wafer 100 illustrated in FIG. 1A. First, as shown in FIG. 1, a layer stack 101 is provided in the wafer 100. The layer stack 101 includes a substrate 140, a first metal pad 112, a scribe line metal pad 132, a material stack 150, a first trench 113, a second trench 123 and a scribe line trench 133.

The wafer 100 may have a wafer material and the substrate 140 in the wafer 100 may include at least a first die region 110 and a scribe line region 130 adjacent to the first die region 110. The substrate 140 may further include a second die region 120. The second die region 120 may be disposed adjacent to the scribe line region 130 so that the scribe line region 130 is disposed between the first die region 110 and the second die region 120. The substrate 140 may include the wafer material and the wafer material may be a semi-conductive material, such as Si, SiGe, GaAs, Ge, SOI (silicon on insulator) or the combination thereof.

The material stack 150 may include one or more staking layers, for example, a silicon material layer 151, a high-k material layer 152 and an oxide layer 153, but the present invention is not limited thereto. The material stack 150 is disposed on the substrate 140 and may include the first die region 110, the second die region 120 and the scribe line region 130. The material stack 150 may have a flat top surface 154. The first metal pad 112 may be disposed in the first die region 110 and in the substrate 140. Similarly, the scribe line metal pad 132 may be disposed in the scribe line region 1130 and in the substrate 140.

Moreover, there may be multiple trenches of different widths disposed in the different regions of the layer stack 101. For example, the first die region 110 may be a CP pad region, the scribe line region 130 may be a WAT pad region and the second die region 120 may be a bottom pad region. Each region may have at least one trench. For example, the first die region 110 may have a first trench 113, the second die region 120 may have a second trench 123 and the scribe line region 130 may have a scribe line trench 133. The first trench 113 may penetrate the material stack 150 and the substrate 140 to expose the underlying first metal pad 112, namely a CP pad in the substrate 140. The second trench 123 may penetrate the material stack 150 to expose the underlying substrate 140. The scribe line trench 133 may penetrate the material stack 150 and the substrate 140 to expose the underlying scribe line metal pad 132, namely a WAT pad in the substrate 140.

Further, the first trench 113, the second trench 123 and the scribe line trench 133 may have different widths. For example, the scribe line trench 133 may have a trench width Ws smaller than that of at least one of the trench width W1 of the first trench 113 and the trench width W2 of the second trench 123. The width W1 and the width W2 may be different. For example, the width W2 may be the smallest of the W1, W2, and Ws. In one embodiment of the present invention, each trench may have a variable trench width. For example, the first trench 113 may have a larger trench opening To than the trench bottom Tb, and the scribe line trench 133 may have a larger trench opening So than the trench bottom Sb. The layer stack 101 may be for use in a CMOS image sensor, for example for use in the backside illumination production.

Figure 2:
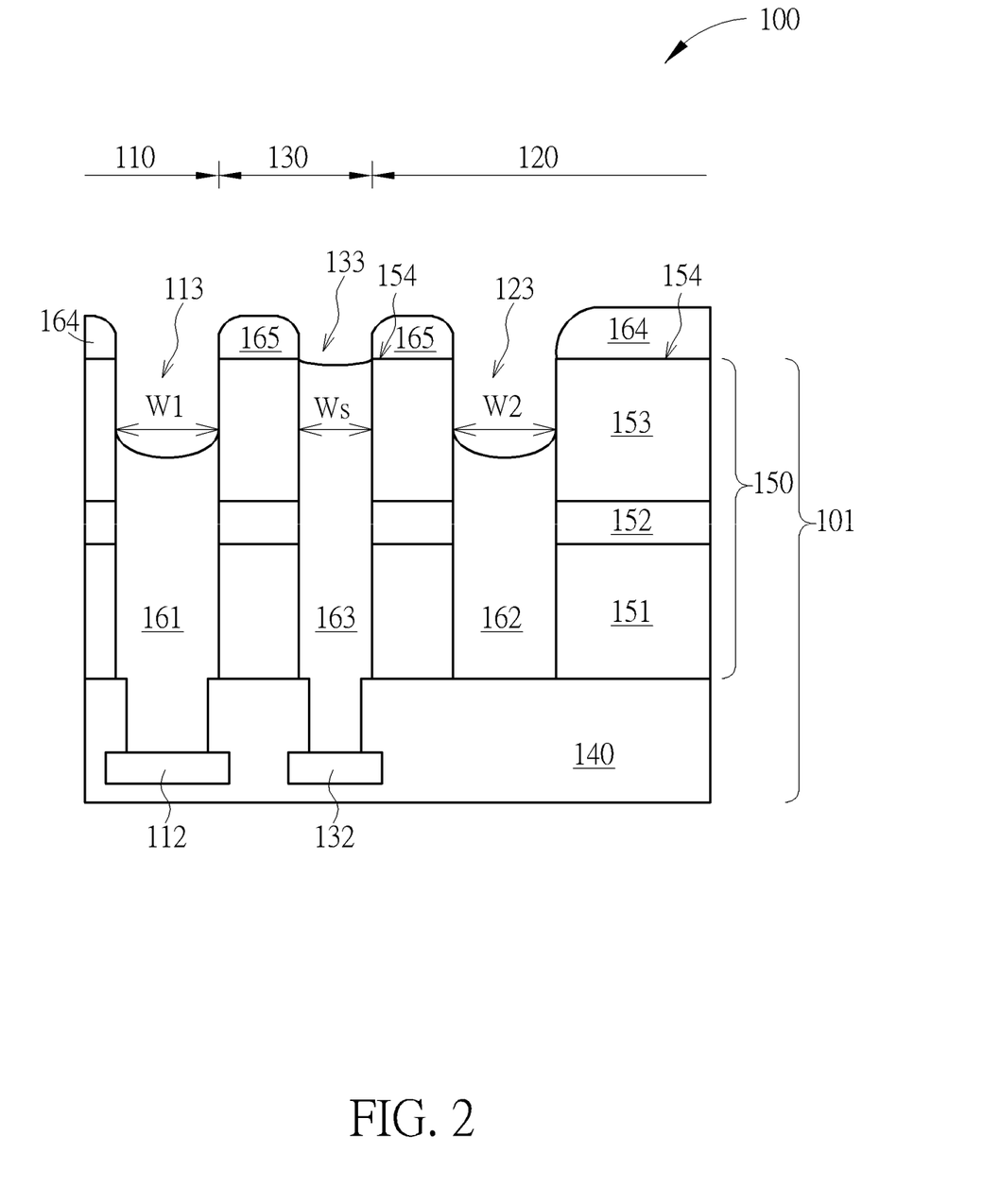

FIG. 2 illustrates a cross-sectional view along the line A-A' in FIG. 1A. Second, as shown in FIG. 2, a first filling process, such as a spin coating process, may be carried out. The first filling process may include a first fill-in step and a subsequent first trimming step. The first fill-in step may be carried out to fill the trenches with a first filling material. The trenches may be at least one of the scribe line trench 133, the first trench 113 and the second trench 123. The first filling process may be carried out so that the first filling material may at least partially fill the trenches. For example, the first fill-in step may partially fill the first trench 113 with the first filling material 161 and partially fill the second trench 123 with the first filling material 162 due to a larger width, such as W1 of the first trench 113 or W2 of the second trench 123. The first fill-in step may further substantially fill up the scribe line trench 133 with the first filling material 163 due to a smaller width Ws. For example, the first fill-in step may fill the scribe line trench 133 more than the first trench 113 and the second trench 123 due to its smaller width Ws. Because the filling material may have a certain viscosity, the filling material may tend to fill a narrow trench more favorably so a wider trench would inevitably have been less filled than a narrower one. The first spin coating process of the first fill-in step may target a narrower trench first to make it flatter.

Figure 2A:
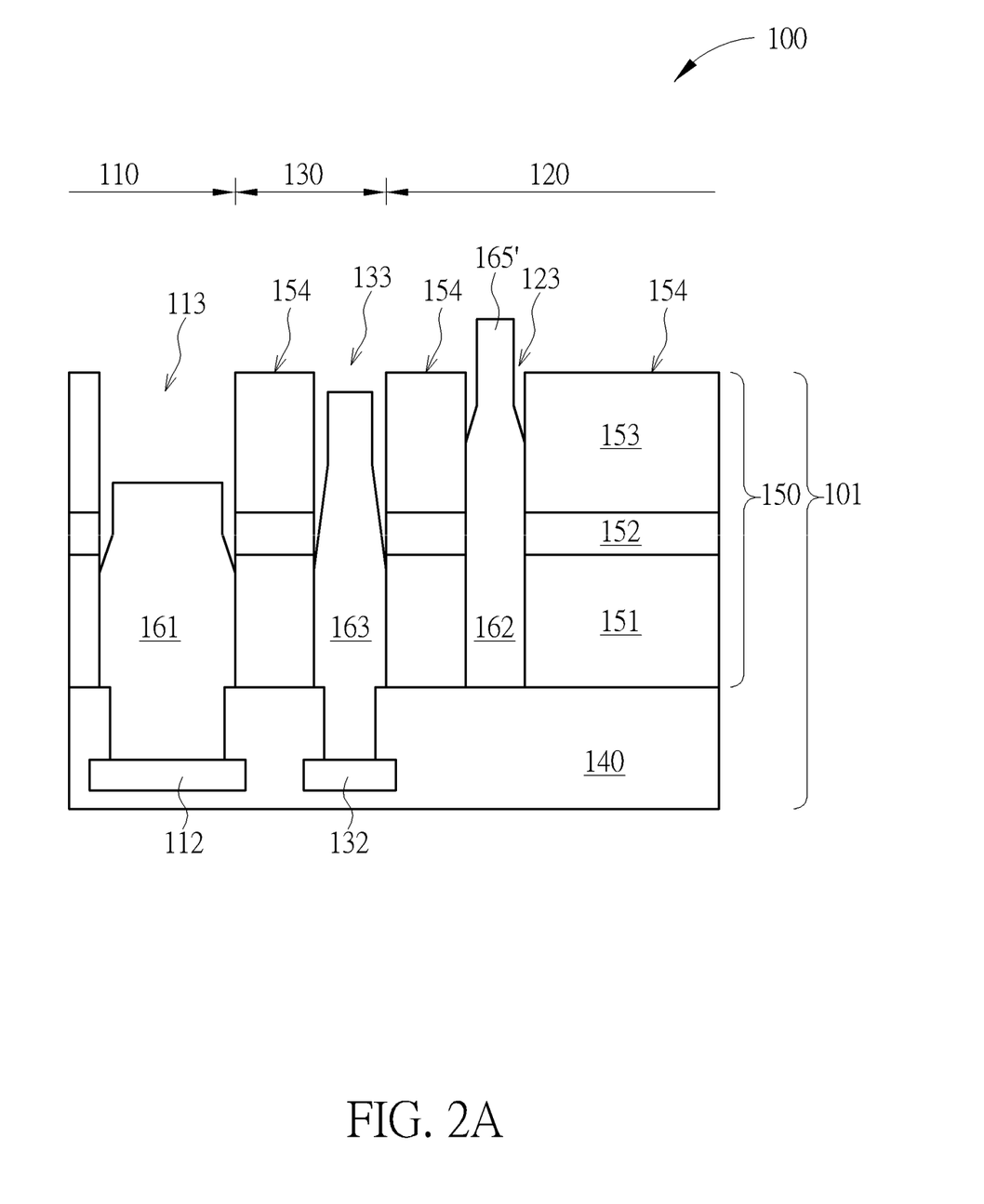
FIG. 2A illustrates some first residual may be present atop the first filling material outside the flat top surface of the material stack in accordance with one example of the present invention.

After the first fill-in step, there may be some first residual (the residual of the first filling material 161, 162, 163) formed to be disposed on the surface of the material stack 150, for example on the flat top surface 154 of the wafer 100. In some embodiment, some first residual 164 may be formed to be disposed adjacent to the openings of at least one of the first trench 113 and the second trench 123 while the first trench 113 and the second trench 123 may not be completely full of the first filling material. At the same time, some first residual 165 may be formed to be disposed adjacent to the first filling material 163 in the scribe line trench 133 while the scribe line trench 133 may be substantially full of the first filling material 163. In another embodiment of the present invention, some first residual 165' may be present atop the first filling material 162 outside the flat top surface 154 of the material stack 150, as shown in FIG. 2A, due to an even smaller width. The first filling material 161, the first filling material 162, the first filling material 163 may be a soft material, for example a photoresist material, such as a negative photoresist-like material. A negative photoresist-like material stays on the top surface after receiving UV light during the photolithography.

Figure 2B:
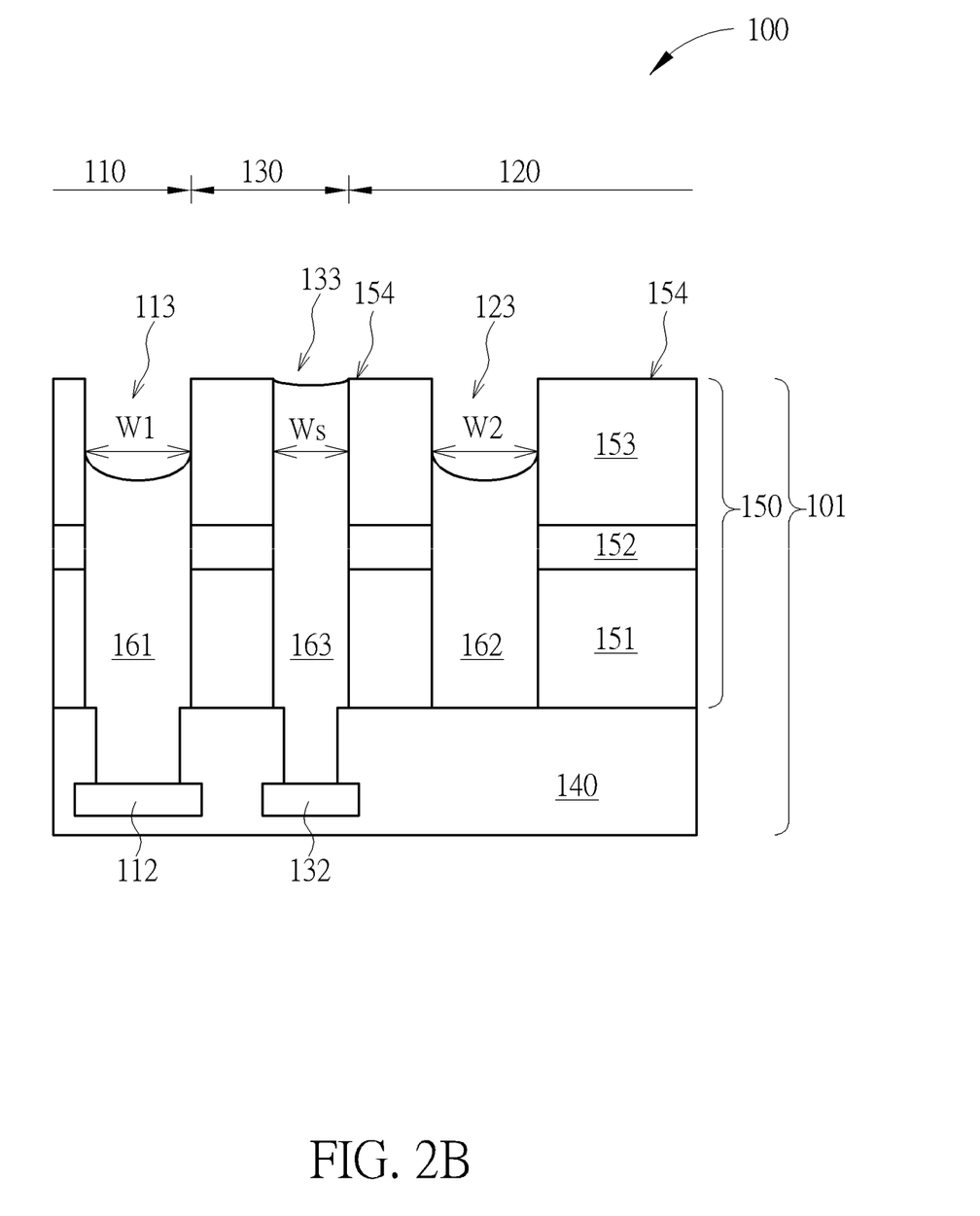
FIG. 2B illustrates a trimming step to remove residuals in accordance with one example of the present invention.

After the first fill-in step, the first trimming step may be carried out to remove at least most of the first residual 164, the first residual 165, preferably all of the first residual 164 and the first residual 165, as shown in FIG. 2B, form the wafer surface. After the first trimming step, the first trench 113 and the second trench 123 may remain half-full and the scribe line trench 133 may remain substantially full.

Figure 3:
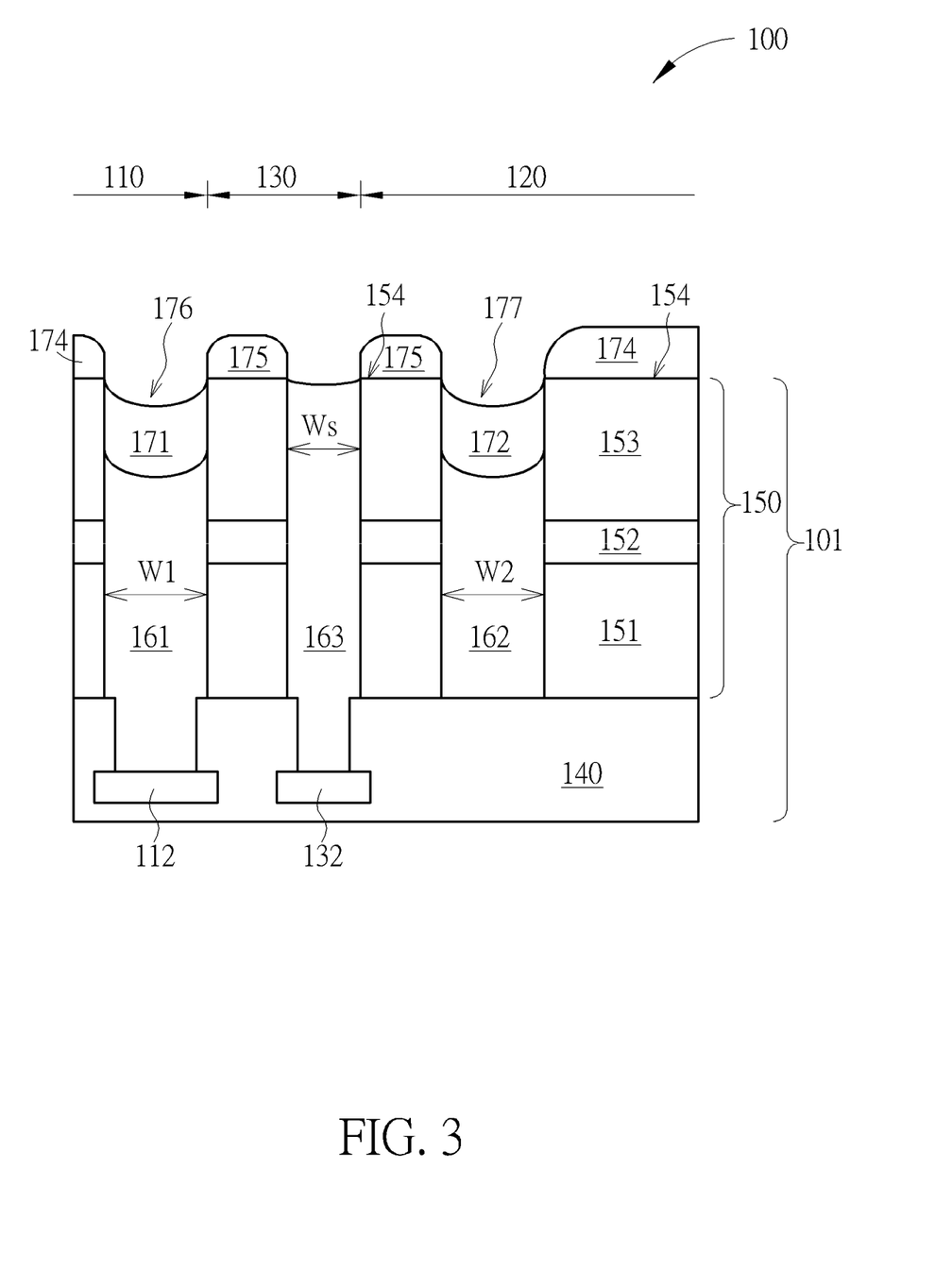

FIG. 3 illustrates a cross-sectional view along the line A-A' and corresponding to FIG. 1A. Another filling process, for example a second filling process such as another spin coating process, may be carried out to fill up the first trench 113 and the second trench 123 after the first filling process. This second filling process following the first filling process may include a second fill-in step and a subsequent second trimming step. As shown in FIG. 3, the second fill-in step may be carried out to fill the first trench 113 with a second filling material 171 and fill the second trench 123 with the second filling material 172. The second fill-in step may add additional fill height to wider trenches to make the filler surface in the wider trenches closer to the surface of the wafer, i.e. the surface of the wafer becomes flatter. The second filling material may fill the first trench 113 and the second trench 123 as much as possible to reduce the size of the trenches after the first filling process. For example, the first filling material 161 and the second filling material 171 may together substantially fill up the first trench 113, and the first filling material 162 and the second filling material 172 may together substantially fill up the second trench 123. The second fill-in step may optionally skip the scribe line region 130.

In some embodiment, if the second filling material does not fill up the first trench 113 and the second trench 123, only a small depression may be present adjacent to the openings of the first trench 113 or the second trench 123. For example, a first depression 176 may be disposed on the second filling material 171 of the first trench 113. Similarly, a second depression 177 may be disposed on the second filling material 172 of the second trench 123. Compared with the first trench 113 and with the second trench 123 before the first filling process or after the first filling process, the first depression 176 or the second depression 177 is just too small in size to be significant. In other words, the trenches may be regarded as full of one or more filling materials. For example, the scribe line trench 133 may be substantially filled with the first filling material 163, the first trench 113 may be substantially filled with the first filling material 161 and the second filling material 171, and the second trench 123 may be substantially filled with the first filling material 162 and with the second filling material 172 no matter one or more depressions are present or not.

After the second fill-in step, there may be some second residual (the residual of the second filling material 171, 172)

formed to be disposed on the flat top surface 154 of the material stack 150. For example, some second residual 174 may be formed to be disposed adjacent to the openings of at least one of the first trench 113 and the second trench 123 while the first trench 113 may have the optional first depression 176 or the second trench 123 may have the optional second depression 177. At the same time, some second residual 175 may be formed to be disposed adjacent to the first filling material 163 of the scribe line trench 133 because the scribe line trench 133 may be almost filled with the first filling material 163 after the first filling process. In some embodiment of the present invention, some second residuals may be present atop the second filling material outside the flat top surface 154 of the material stack 150. The second filling material 171, 172, like the first filling material 161, 162, 163, may be a soft material, for example a photoresist material, such as a negative photoresist-like material. The second filling material 171, the second filling material 172 and the first filling material 161, the first filling material 162, the first filling material 163 may be the same or different.

Figure 4:
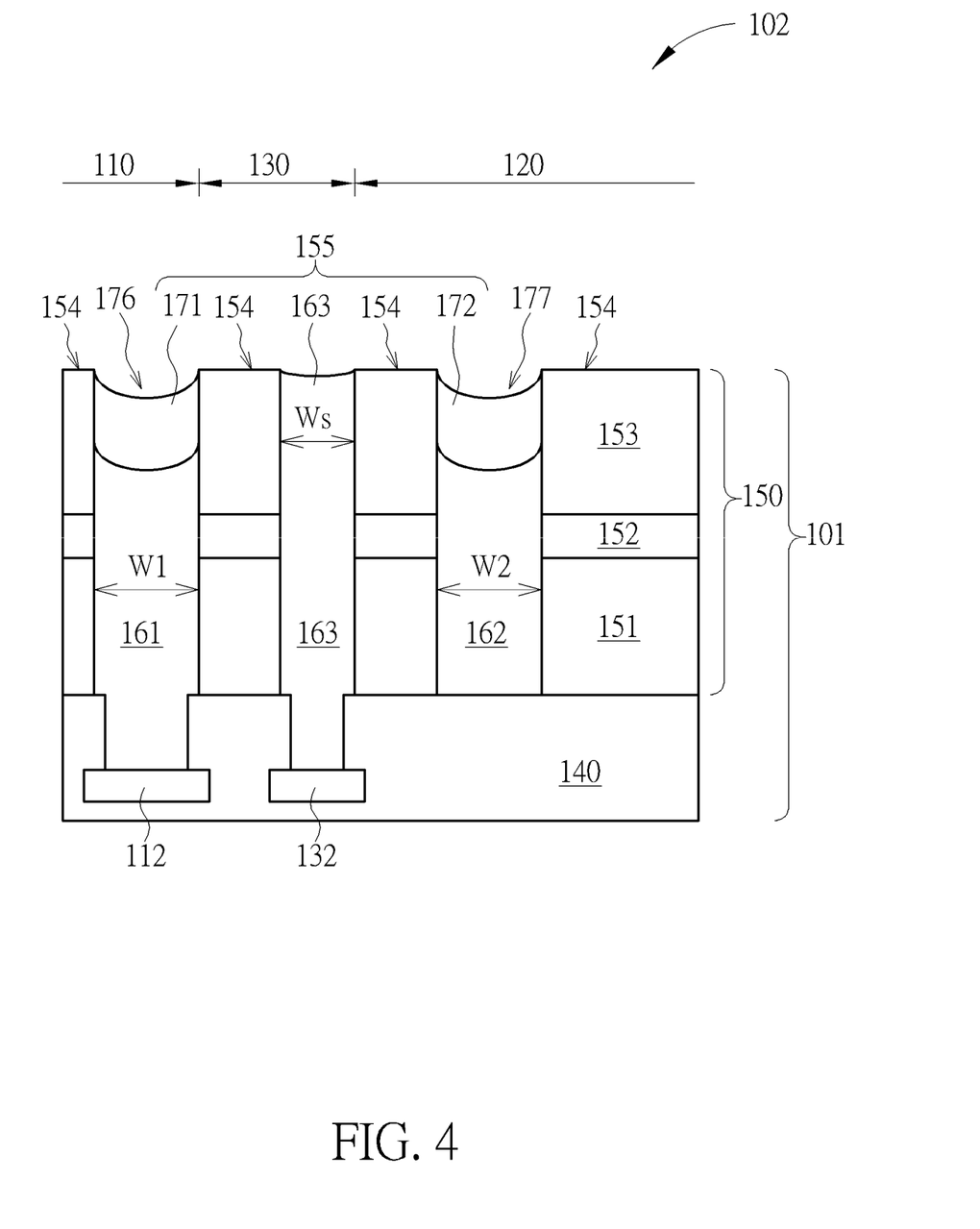

FIG. 4 illustrates a cross-sectional view along the line A-A' in accordance with FIG. 1A. After the second fill-in step, the second trimming step may be carried out to remove at least most of the second residual 174 and the second residual 175, preferably to remove all of the second residual 174 and the second residual 175 from the wafer surface. After the second trimming step, the first trench 113 and the second trench 123 may be full or with the first depression 176 and/or the second depression 177, as shown in FIG. 4.

After the second fill-in step to remove the second residual 174 and the second residual 175, a stack structure 102 may be obtained. The stack structure 102 may include the layer stack 101, a first die region 110, a second die region 120, a scribe line region 130, the first filling material 161, the first filling material 162, the first filling material 163, the second filling material 171 and the second filling material 172. The stack structure 102 may further include the optional first depression 176 and the optional second depression 177. In particular, the flat top surface 154 of the material stack 150, the first filling material 163, the second filling material 171 and the second filling material 171 may together form an optical uniform surface 155 to construct topography of the stack structure 102 with or without the presence of the first depression 176 or of the second depression 177. This excellent optical uniform surface 155 is advantageous in constructing the substantially uniform topography, such as the optical uniform surface 155, of the stack structure 102. With the presence of the substantially uniform topography of the stack structure 102, an optical layer may be further formed atop the flat top surface 154 of the stack structure 102 to be optically striation-free by visual inspection.

Figure 5:
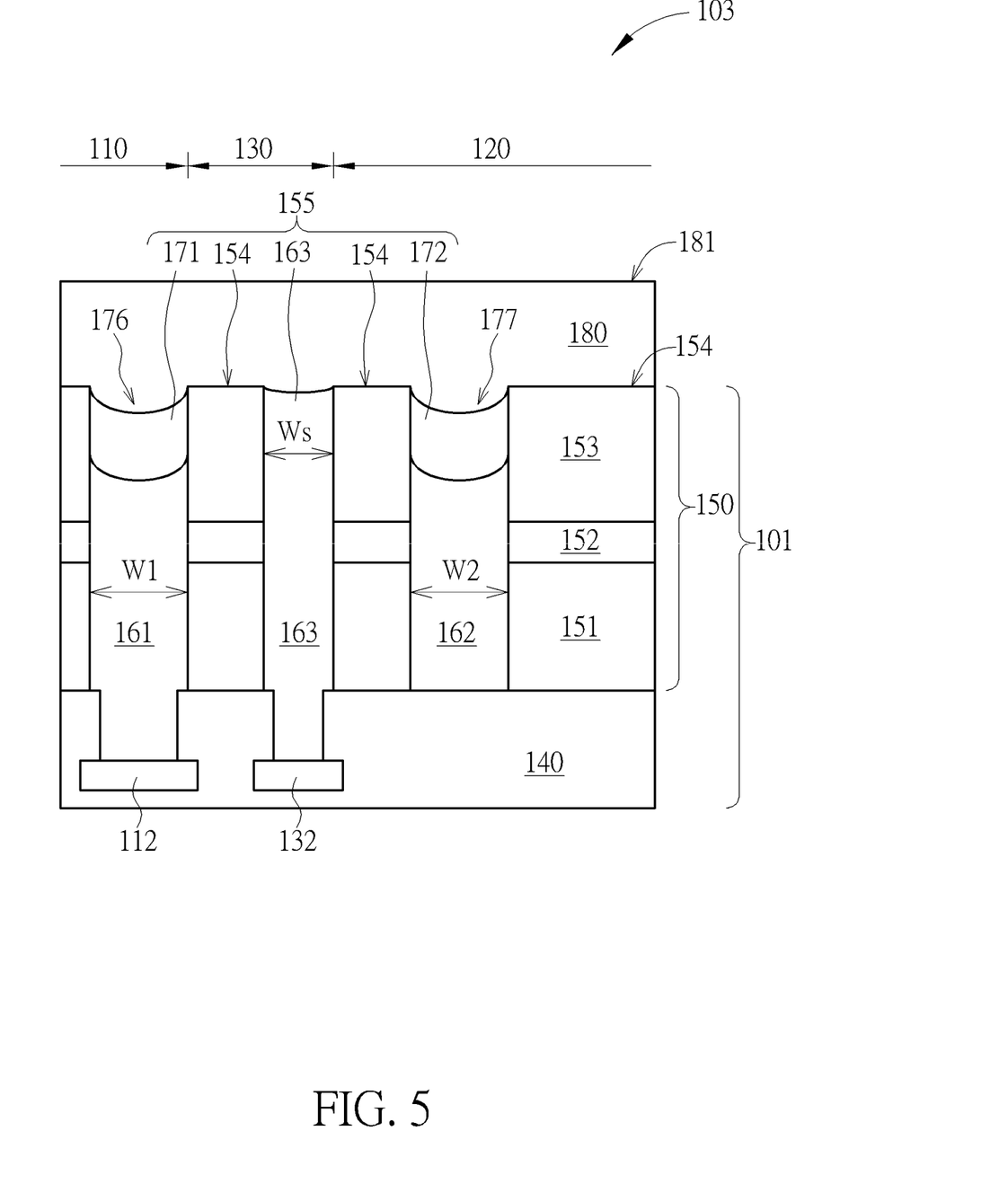
FIG. 5 illustrate a cross-sectional view of a color filter structure in accordance with one example of the present invention.

FIG. 5 illustrates a cross-sectional view along the line A-A' corresponding to FIG. 1A. Next, as shown in FIG. 5, an optical layer may be further formed atop the substantially uniform topography of the stack structure 101 with the excellent optical uniform surface 155 to obtain a color filter structure 103. For example, a color filter layer 180 may be formed atop the substantially uniform topography of the stack structure to serve as an optical layer.

The color filter structure 103 may include layer stack 101, a first die region 110, a second die region 120, a scribe line region 130 and a color filter layer 180. The color filter layer 180 may have a uniform top surface 181 and include at least one of a color filter, such as a red color filter (not shown), a green color filter (not shown) or a blue color filter (not shown) to correspond to the CMOS image sensors (not shown) in the color filter structure 103, but the present invention is not limited to these. The uniform top surface 181 preferably may exhibit no optical striation by visual inspection by the support of the underlying uniform topography of the stack structure 102 as shown in FIG. 4.

The optical uniform surface 155 may be covered with a color filter material of the color filter layer 180 to obtain the color filter structure 103. The layer stack 101 may include a first metal pad 112, a first trench 113, a second trench 123, a scribe line trench 133, a scribe line metal pad 132, a substrate 140, a material stack 150, a first filling material 161, a first filling material 162, a first filling material 163, a second filling material 171 and a second filling material 172. The material stack 150 may include, for example, a silicon material layer 151, a high-k material layer 152 and a topmost oxide layer 153, but the present invention is not limited thereto.

Preferably, the optical layer 180 may have an optically uniform surface, for example the uniform top surface 181, to exhibit optimal optical quality. The color filter layer 180 may be in direct contact with the topmost layer, for example the oxide layer 153 of the material stack 150, and in direct contact with the filling materials, for example the first filling material 163, the second filling material 171 and the second filling material 172. The color filter layer 180 may fill up the optional first depression 176 or the optional second depression 177 if the first depression 176 or the second depression 177 is present. In particular, the color filter material of the color filter layer 180 may cover and/or fill the underlying first depression 176 or the underlying second depression 177 without deforming the optical uniform surface 155.

The optical uniform surface 155 may not necessarily be a structurally flat surface but rather, it may exhibit an optically uniform quality to an observer. The material stack 150, the first filling material and the second filling material may together form the optical uniform surface 155 to construct topography of the stack structure 102. In one embodiment, the color filter layer 180 together with the underlying substantially uniform topography of the stack structure 102 with the excellent optical uniform surface 155 may show no visible optical striation, in other words, the color filter layer 180 atop the substantially uniform topography of the stack structure 102 is free of optical striation by visual inspection. This structural feature of the color filter structure 103 is advantageous in improving the optical quality of the color filter layer 180 of the color filter structure 103 for use in a CMOS image sensor, for example for use in the backside illumination production.

After the above steps, the present invention in another aspect provides a color filter structure 103. The color filter structure 103 may include a substrate 140, a first metal pad 112, a scribe line metal pad 132, a material stack 150, a first trench 113, a second trench 123, a scribe line trench 133, a first filling material, a second filling material and a color filter material 180. The substrate 140 may include a first die region 110, a second die region 120 and a scribe line region 130 adjacent to the first die region 110 so that the scribe line region 130 may be disposed between the first die region 110 and the second die region 120. For example, the first die region 110 may be a CP pad region, the scribe line region 130 may be a WAT pad region and the second die region 120 may be a bottom pad region.

In one embodiment of the present invention, the material stack 150 may include one or more layers, for example a silicon material layer 151, a high-K material layer 152 and an oxide layer 153, but the present invention is not limited thereto. The material stack 150 may have a flat top surface 154.

The first metal pad 112 is disposed in the first die region 110 and in the substrate 140. The scribe line metal pad 132 is disposed in the scribe line region 130 and in the substrate 140. The material stack 150 is disposed in the substrate 140 and covers the first die region 110, the second die region 120 and the scribe line region 130. The first trench 113 may penetrate the material stack 150 in the first die region 110 and the first trench 113 may expose the first metal pad 112. The second trench 123 may penetrate the material stack 150 in the second die region 120 and expose the substrate 140 in the second die region 120. The scribe line trench 133 may penetrate the material stack 150 in the scribe line region 130 and expose the scribe line metal pad 132.

In one embodiment of the present invention, the trenches may have different trench widths. For example, the first trench 113 may have a width W1, the second trench 123 may have a width W2, and the scribe line trench 133 may have a width Ws. The width Ws may be smaller than at least one of the width W1 and the width W2. Further, the width W1 and the width W2 may be different. For example, the width W2 may be the smallest of the W1, W2, and Ws.

The first filling material may respectively partially fill the first trench 113 and the second trench 123. For example, the first filling material 161 may partially fill the first trench 113 and the first filling material 162 may partially fill the second trench 123. The first filling material 163 may substantially fill up the scribe line trench 133. The second filling material may respectively partially fill the first trench 113 and the second trench 123. For example, the second filling material 171 may partially fill the first trench 113 and the second filling material 172 may partially fill the second trench 123. In one embodiment of the present invention, at least one of the first filling material and the second filling material may include a soft material, for example a photoresist material, such as a negative photoresist-like material. A negative photoresist-like material stays on the top surface after receiving UV light during the photolithography.

The first filling material together with the second filling material may substantially fill up the first trench 113 and the second trench 123. For example, the first filling material 161 together with the second filling material 171 may fill up the first trench 113, and the first filling material 162 together with the second filling material 172 may fill up the second trench 123. The flat top surface 154 of the material stack 150, the first filling material and the second filling material may together form an optical uniform surface 155 to construct topography of the layer stack 101.

The color filter material of a color filter layer 180 may cover the optical uniform surface 155. In other words, the color filter material may cover the first trench 113, the second trench 123, the scribe line trench 133, the flat top surface 154 of the material stack 150, the first filling material 161, the first filling material 162, the first filling material 163, the second filling material 171 and the second filling material 172 respectively disposed in the first die region 110, in the second die region 120 and in the scribe line region 130.

In one embodiment of the present invention, the color filter structure 103 may further include a first depression 176 disposed on the second filling material 171 of the first trench 113. The color filter material may cover the optional first depression 176 without deforming the optical uniform surface 155. In another embodiment of the present invention, the color filter structure 103 may further include a second depression 177 disposed on the second filling material 172 of the second trench 123. The color filter material may cover the optional second depression 177 without deforming the optical uniform surface 155.

Figure 6A:
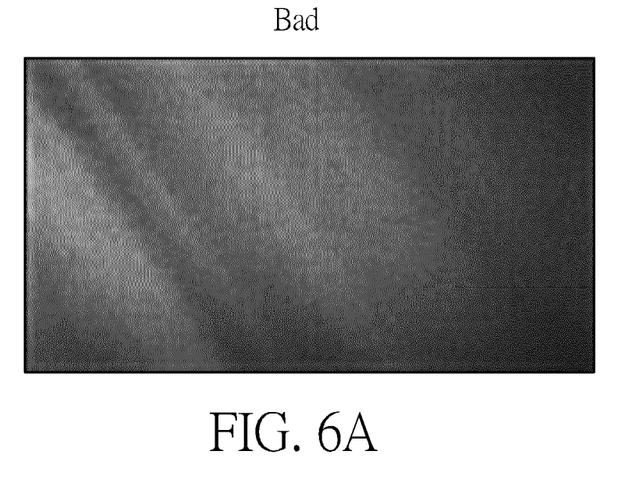
FIG. 6A illustrates a top view of a color filter in a die region in accordance with prior art.
Figure 6B:
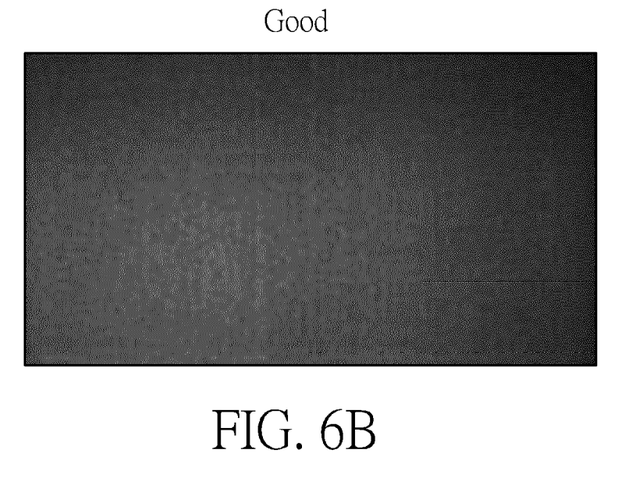
FIG. 6B illustrates a top view of a color filter structure in a die region in accordance with the present invention.

FIG. 6A illustrates a top view of a color filter in a die region in accordance with prior art and FIG. 6B illustrates a top view of a color filter structure in a die region in accordance with one example of the present invention. The color filter in FIG. 6A exhibits some optical striation to show bad optical quality. In contrast, the color filter structure in FIG. 7B shows no optical striation with better quality to exhibit good optical quality. In particular, dies should pass the electrical striation test with the color filter structure shown in FIG. 6B, but may fail to pass the electrical striation test with the color filter structure shown in FIG. 6A.

Table 1 shows the experimental FIB results with respect to the color filter subjected to a single filling process in accordance with prior art. Table 2 shows the experimental FIB results with respect to the color filter structure subjected to a dual filling process in accordance with the embodiments of the present invention. A dual filling process refers to a combination of at least a first filling process and a second filling process.

TABLE 1

(Single filling process of prior art)

| Samples | CP pad | | WAT Pad | | Bottom Pad Opening | |
| --- | --- | --- | --- | --- | --- | --- |
| | Edge | Center | Edge | Center | Center | Edge |
| FIB results | −1.44 | −1.5 | 0.16 | −0.23 | 0.44 | 0.47 |

TABLE 2

(Dual Filling Process)

| Samples | CP pad | | WAT Pad | | Bottom Pad Opening | |
| --- | --- | --- | --- | --- | --- | --- |
| | Center | Edge | Center | Edge | Center | Edge |
| FIB results | −0.21 | −0.3 | 0.49 | 0.34 | 0.64 | 0.69 |

FIB results indicate how flat the surface is. The ideal case is 0.

The method of the present invention proposes a second filling process to facilitate the filling of trenches of different widths in addition to a first filling process. After the second filling process, trenches of different widths are filled up with sufficient filling materials to diminish any possible recess disposed on the first filling material in any trench. Extra fill-in process may focus on those deeper pad areas to reduce the backside topography gaps which cause the striation issue.

Accordingly, the material stack, the first filling material and the second filling material may together form an optical uniform surface to construct ideal topography of the stack structure. Moreover, the ideal topography is advantageous to keep a color filter atop the optical uniform surface from generating optical striation when the color filter is examined by visual inspection to obtain a color filter of better quality and yield. To make backside topography flatter improves the striation issue at same time.

The method of the present invention may provide a novel structure substantially free of striation, better process window, or better process control. It is possible that products with striation yield improvement by ~40%.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A color filter structure, comprising:
   a substrate comprising a first die region and a scribe line region adjacent to the first die region;
   a first metal pad disposed in the first die region and in the substrate;
   a scribe line metal pad disposed in the scribe line region and in the substrate;
   a material stack disposed in the substrate and covering the first die region and the scribe line region;
   a first trench penetrating the material stack and exposing the first metal pad;
   a scribe line trench penetrating the material stack and exposing the scribe line metal pad;
   a first filling material partially filling the first trench and substantially filling up the scribe line trench;
   a second filling material partially filling the first trench, wherein the first filling material and the second filling material together substantially fill up the first trench; and
   a color filter material covering an optical uniform surface which the material stack, the first filling material and the second filling material together form.

2. The color filter structure of claim 1, further comprising:
   a second die region which the substrate comprises and is adjacent to the scribe line region so that the scribe line region is disposed between the first die region and the second die region;
   a second trench penetrating the material stack and exposing the substrate in the second die region;
   the first filling material and the second filling material together substantially filling up the second trench; and
   the color filter material covering the second trench.

3. The color filter structure of claim 2, wherein the width of the scribe line trench is smaller than the width of at least one of the first trench and the second trench.

4. The color filter structure of claim 1, further comprising:
   a first depression disposed on the second filling material of the first trench, wherein the color filter material covers the first depression without deforming the optical uniform surface.

5. The color filter structure of claim 2, further comprising:
   a second depression disposed on the second filling material of the second trench, wherein the color filter material covers the second depression without deforming the optical uniform surface.

6. The color filter structure of claim 1, wherein the material stack comprises a silicon material, a high K material and an oxide.

7. The color filter structure of claim 1, wherein at least one of the first filling material and the second filling material comprises a photoresist material.

8. The color filter structure of claim 1, being free of optical striation by visual inspection.

9. A method to construct topography of a stack structure, comprising:
   providing a layer stack, comprising:
      a substrate comprising a first die region and a scribe line region adjacent to the first die region;
      a first metal pad disposed in the first die region and in the substrate;
      a scribe line metal pad disposed in the scribe line region and in the substrate;
      a material stack disposed in the substrate and covering the first die region and the scribe line region;
      a first trench penetrating the material stack and exposing the first metal pad;
      a scribe line trench penetrating the material stack and exposing the scribe line metal pad; and
   performing a first filling process to fill the first trench and the scribe line trench with a first filling material;
   performing a second filling process to fill the first trench with a second filling material without filling the scribe line trench to obtain a stack structure, wherein the first filling material and the second filling material together substantially fill up the first trench; and
   covering an optical uniform surface with a color filter material to obtain a color filter structure, wherein the material stack, the first filling material and the second filling material together form the optical uniform surface to construct topography of the stack structure.

10. A method to construct topography of a stack structure of claim 9, wherein the first filling process comprises:
    performing a first fill-in step to fill the first trench and the scribe line trench with a first filling material and forming a first residual disposed on the surface of the material stack; and
    performing a first trimming step to remove the first residual.

11. A method to construct topography of a stack structure of claim 9, wherein the second filling process comprises:
    performing a second fill-in step to fill the first trench with the second filling material and forming a second residual disposed on the surface of the material stack; and
    performing a second trimming step to remove the second residual.

12. A method to construct topography of a stack structure of claim 9, wherein the first filling material partially filling the first trench and substantially filling up the scribe line trench after the first filling process.

13. A method to construct topography of a stack structure of claim 9, further comprising:
    performing the first filling process to fill a second trench with the first filling material, wherein the second trench penetrates the material stack and exposing the substrate in a second die region;
    performing the second filling process to fill the second trench with the second filling material, wherein the first filling material and the second filling material together substantially fill up the second trench.

14. A method to construct topography of a stack structure of claim 13, wherein the width of the scribe line trench is smaller than the width of at least one of the first trench and the second trench.

15. A method to construct topography of a stack structure of claim 9, further comprising:
    filling a first depression disposed on the second filling material of the first trench with the color filter material, wherein the color filter material covers the first depression without deforming the optical uniform surface.

16. A method to construct topography of a stack structure of claim 13, further comprising:
    filling a second depression disposed on the second filling material of the second trench with the color filter material, wherein the color filter material covers the second depression without deforming the optical uniform surface.

17. A method to construct topography of a stack structure of claim 9, wherein the material stack comprises a silicon material, a high K material and an oxide.

18. A method to construct topography of a stack structure of claim 9, wherein at least one of the first filling material and the second filling material comprises a photoresist material.

19. A method to construct topography of a stack structure of claim 9, wherein the optical uniform surface is free of optical striation by visual inspection.

* * * * *